United States Patent [19]

Bae

[11] Patent Number: 5,578,423
[45] Date of Patent: Nov. 26, 1996

[54] METHOD FOR THE PREPARATION OF A PATTERN OVERLAY ACCURACY-MEASURING MARK

[75] Inventor: Sang M. Bae, Kyoungki-do, Rep. of Korea

[73] Assignee: Hyundai Electronics Industries Co., Ltd., Kyoungki-do, Rep. of Korea

[21] Appl. No.: 321,448

[22] Filed: Oct. 12, 1994

[30] Foreign Application Priority Data

Oct. 15, 1993 [KR] Rep. of Korea ............... 93-21405

[51] Int. Cl.$^6$ ................ G03C 5/00; G03F 7/36
[52] U.S. Cl. ............ 430/314; 430/316; 430/317; 437/924; 156/657.1; 156/659.11; 156/662.1
[58] Field of Search ............... 156/625, 657, 156/659.1, 662, 664; 437/924; 430/327, 314, 316, 317

[56] References Cited

U.S. PATENT DOCUMENTS 4,992,394 2/1991 Kostelak, Jr. et al. ............ 437/924
5,128,280 7/1992 Matsumoto et al. ............... 437/924

*Primary Examiner*—Janet C. Baxter
*Assistant Examiner*—Christopher G. Young
*Attorney, Agent, or Firm*—Nath & Associates; Gary M. Nath

[57] ABSTRACT

A method for the preparation of a pattern overlay accuracy-measuring mark, consisting of an inner box and an outer box. The method creates a groove along the inside boundary line of the outer box so as to form an enlarged step. The enlarged step prevents inaccuracy in defining the boundary line of the outer box whose inaccuracy is mainly attributed to reflow which occurs at the boundary line as a metal layer is later coated over the outer box. The method can easily define the boundary line and thus more define the overlay accuracy.

7 Claims, 4 Drawing Sheets

METHOD FOR THE PREPARATION OF A PATTERN OVERLAY ACCURACY-MEASURING MARK

BACKGROUND OF THE INVENTION

1. Field of the Invention

The present invention relates, in general, to a method for preparing a pattern overlay accuracy-measuring mark useful in the fabrication of semiconductor device particularly, an improvement in measurement of overlay accuracy.

2. Description of the Prior Art

Generally, a semiconductor device is fabricated by complicated processes wherein a plurality of light-exposure masks are repeatedly aligned by a stepper. The stepper, which is a limited light-exposing apparatus operable in a step-and-repeat manner repeatedly moves a stage in an x-y direction so as to align the masks prior to exposure to light. By means of the stepper, a wafer is aligned in a manual or automatic manner on the basis of an alignment mark. At the moment, an error may be generated by mechanical motion of the stage during alignment. If this alignment error exceeds an allowable limit, a defect may be generated in the semiconductor device.

Usually, an overlay accuracy-measuring mark, involving an upper mark which is overlapped with a lower mark, measures alignment error. The control range of overlay accuracy for misalignment acts on the design rule of the semiconductor device and is typically in a range of 20 to 30%.

Although the alignment mark relies upon layer-to-layer alignment between different light-exposure masks, it is really used for the alignment between dies with respect to one light-exposure mask. The alignment mark is detected by the recognizer of the stepper in advance of a light-exposing step, which is necessary to revise the overlay accuracy between two patterns thus formed, the accuracy of which has been measured by additional measuring equipment. The term "die" used herein means the total region that is formed by one light-exposing process, and one die may include a plurality of semiconductor devices.

The alignment mark and the overlay accuracy-measuring mark are formed on a scribe line, which can be a portion of wafer where no semiconductor chip is mounted. One method for measuring the degree of misalignment with the measuring mark, involves either visual checking using a vernier-measuring mark, or automatic checking using a box-in-box or bar-in-bar measuring mark.

In order to better understand the background of the invention, a description is given for the conventional box-in-box measuring mark with reference to some drawings.

Referring to FIG. 1, is shown a scribe line 1 which comprises an outer box 3 and an inner box 4. The outer box 3 is formed by removing a lower film on the scribe line typically measuring 20×20 µm², whereas the inner box 4 is formed by leaving an upper film at the central portion of the outer box typically measuring 10×10 µm².

FIG. 2 shows a cross sectional view taken generally through line II—II of FIG. 1. As shown in this figure, a plurality of layers is deposited over the scribe line of a wafer 11. A first layer 12 is formed on the wafer 11, followed by deposition of a second layer 13 thereon. The second layer 13 is then patterned by photo etching, that portion of the second layer 13 over the scribe line is removed to form the outer box FIG. 1. The inner box is formed by affixing a third layer 14, the central portion of which is covered with a photosensitive pattern 15. The photosensitive pattern serves as a mask when the third layer is photoetched.

The overlay accuracy measuring mark method also includes gauging distances between the sides of the outer box and the inner box, comparing the distances from one another, and revising the misalignment of the X-Y axes of stage. Therefore, it is obvious that the boundary lines of the boxes must be accurately defined for maximum overlay accuracy. The boundary lines are usually determined by irradiating a light and sensing the reflected light.

However, the conventional methods have difficulty in practice. For example, assuming that the second layer 13 is formed with a relatively thin polysilicon film or insulating film and the third layer 14 is a metal layer composed of tungsten or Al—Cu—Si alloy, when the metal layer is deposited, smoothly curved flow occurs at the edge portions of the outer box, restraining accurate definition of the boundary line therein. In addition, since the component metals of Al—Cu—Si alloy are different in grain size, the boundary line of the outer box may not be definitely determined or may zigzag along the box.

In an effort to overcome the difficulty of defining the boundary line, a measurement is made after the metal layer is deposited over the etched outer box. However, production of the measuring mark is complicated and any small defect in the etching step lowers reliability of the resulting semiconductor device.

SUMMARY OF THE INVENTION

Therefore, it is an object of the present invention to overcome the above problems encountered in the prior art method of this type and to provide a method for the preparation of a pattern overlay accuracy-measuring mark while preventing inaccuracy in defining the boundary line of the outer box.

The objects could be accomplished by providing a method for the preparation of a pattern overlay accuracy-measuring mark, wherein a groove is formed at the inside boundary line of the outer box.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF PREFERRED EMBODIMENTS

Figure 1:
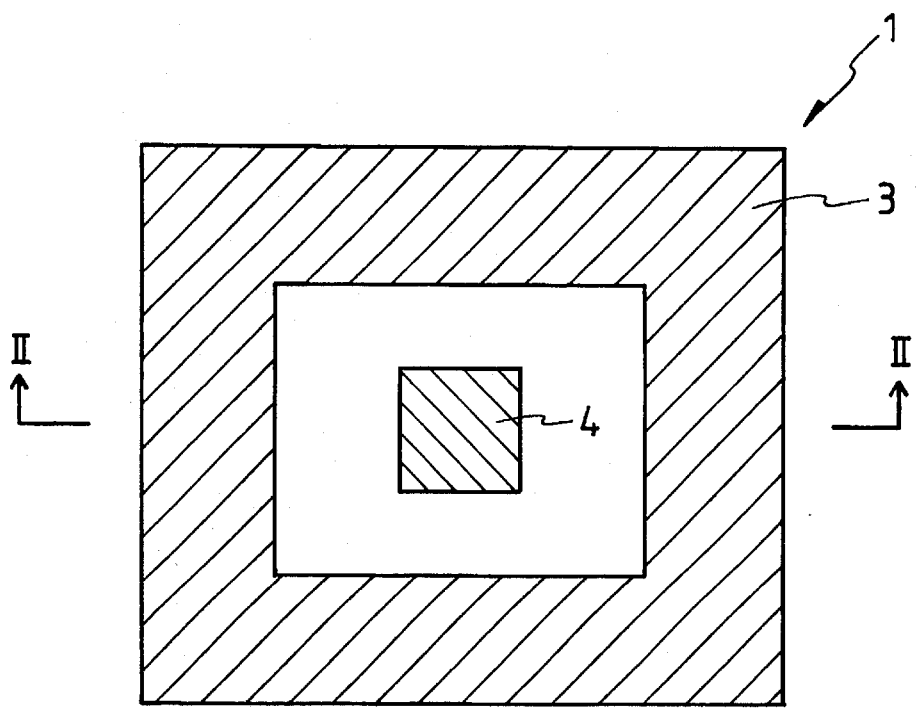
FIG. 1 is a layout of an overlay accuracy-measuring mark according to a conventional method.
Figure 2:
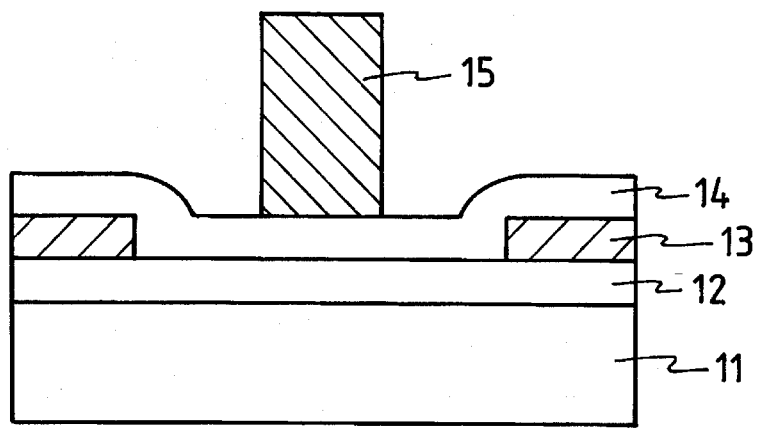
FIG. 2 is a schematic, cross sectional view taken generally through line II—II of FIG. 1.

The preferred embodiments of the present invention are best understood by referring to the accompanying drawings, wherein like reference numerals are used for like and corresponding parts, respectively.

Figure 3:
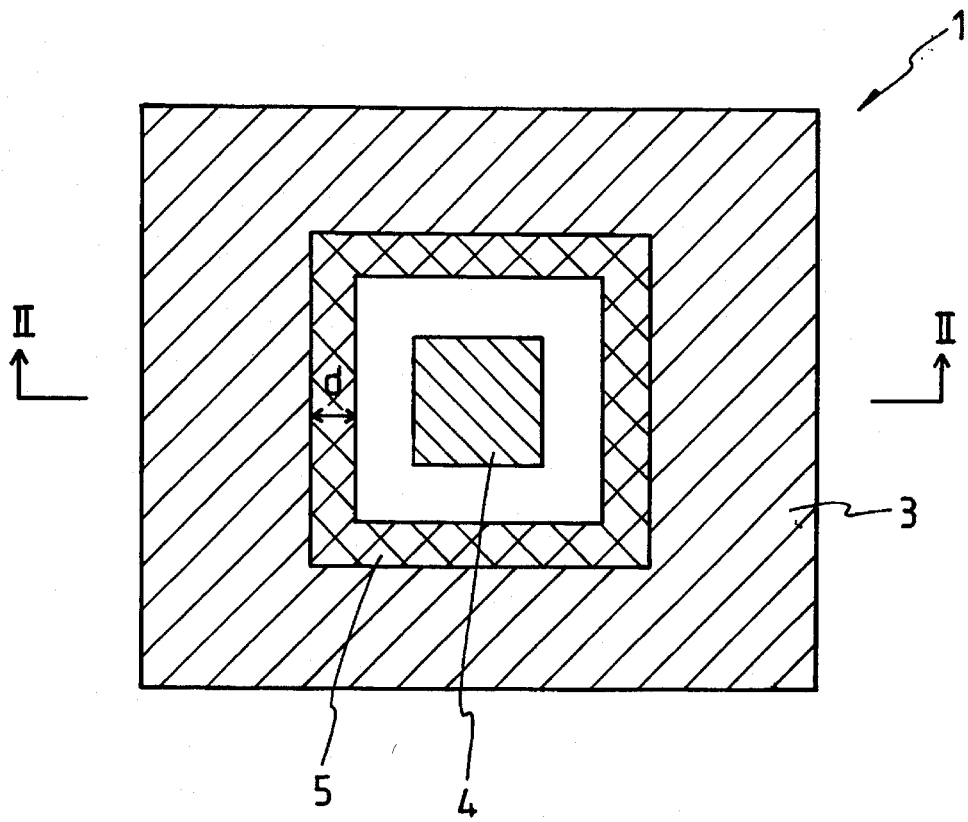
FIG. 3 is a layout of an overlay accuracy-measuring mark according to the present invention.

FIG. 3 shows layout of a box-in-box pattern prepared by the method according to the present invention. As shown in FIG. 3, a lower film over the scribe line of a semiconductor wafer 1 is removed on the order of 20×20 µm² to form an outer box having a regular tetragon shape while an upper film is left over the central portion of the outer box on the order of 10×10 µm² to form an inner box 4 also having a regular tetragon shape. This box-in-box structure has a groove with a width "d" which runs along the inside boundary line of the outer box.

Referring now to FIGS. 4A through 4F, a method is illustrated for the preparation of overlay accuracy-measuring mark according to the present invention.

Figure 4A:
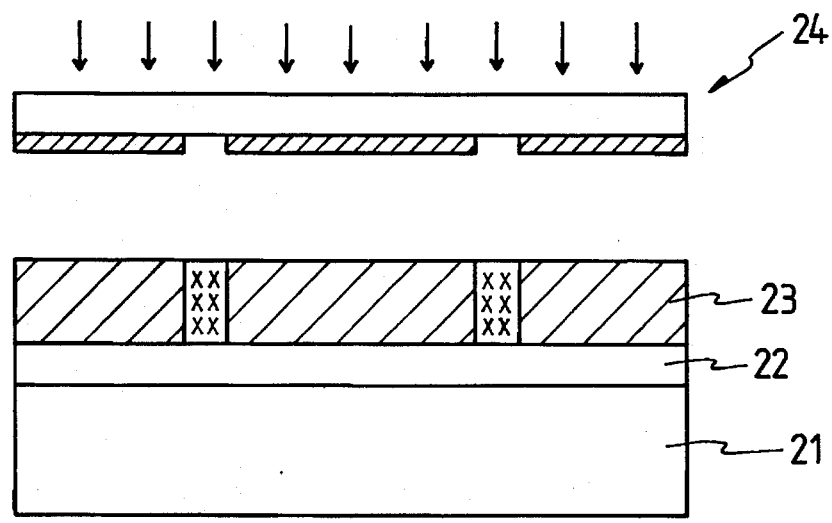
FIGS. 4A through 4F are schematic, cross sectional views taken generally through line II—II of FIG. 3, illustrating the method of the present invention stepwise.

First, a first layer 22, for example, is deposited upon a semiconductor wafer 21, an inter-polyoxide film or insulating film, which is then coated with a first positive photosensitive film 23 which itself serve as a mask when the a photo etching process is carried out to form a pattern of the first layer 22. Thereafter, the first photosensitive film 23 is subjected to light-exposure by use of a first light-exposure mask 24. The mask 24 is structured to expose to light a regular tetragon shape having a side length of 1 to 3 µm of the first photosensitive film 23 that is located inside a predetermined outer box on the scribe line as to discriminate the boundary line, so thereof, as shown in FIG. 4A. The layer 22 may be formed by a subsequent process. In this case, the first layer 22 that is deposited on the chip region of wafer should be removed.

Figure 4B:
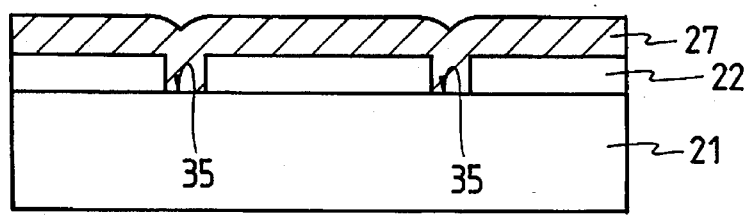

Thereafter, the light-exposed pact of the first photosensitive film 23 is removed to form a pattern and an area of the first layer 22 which is exposed through the pattern is removed by a usual etching process, so as to form a groove 35 along the boundary line of the outer box of regular tetragon, as shown in FIG. 4B. Then the first photosensitive film 23 is removed, followed by formation of a second layer 27, e.g. polysilicon on the entire surface of the wafer.

Figure 4C:
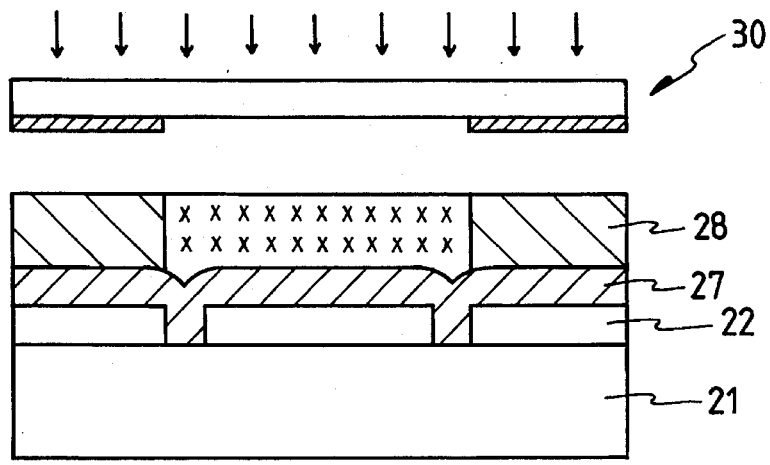

The second layer 27 is coated with a second positive photosensitive film 28 which is then exposed to light by use of a second light-exposure mask 30, as shown in FIG. 4C. The second light-exposure mask, 30, is structured to expose a predetermined area of the second layer 27 in which the outer mark is formed over the scribe line. As will be described later, the second photosensitive film 28 serves as a mask when a photo etching process is carried out to form a pattern of the second layer 22.

Figure 4D:
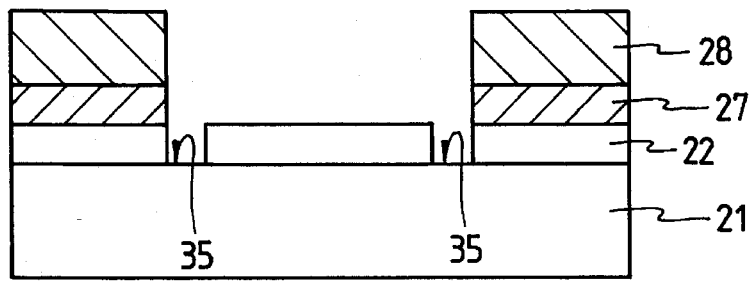

Following formation of the second photosensitive film 28, the area of the second layer 27 which is exposed to light through the second photosensitive film pattern is removed to form the outer box. The outer box has a size of 20×20 µm² with the grooves 35 and the first layer 22 therebetween being exposed, as shown in FIG. 4D. At the moment, it is noted that there are enlarged stepped parts at edge portions of the outer box owing to the grooves.

Figure 4E:
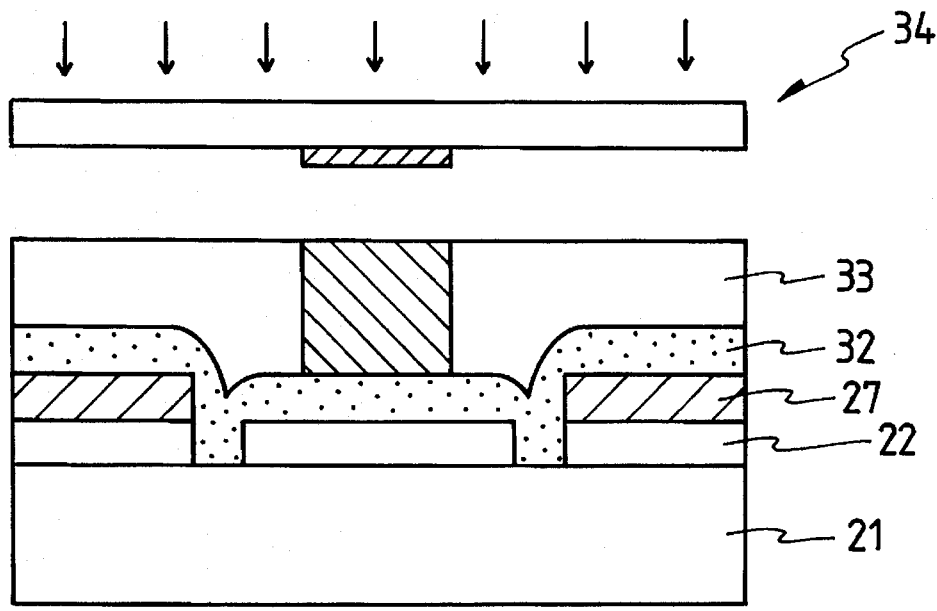
Figure 4F:
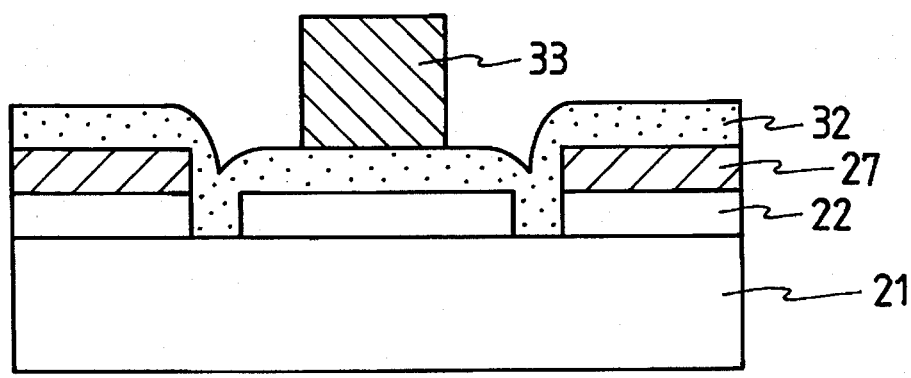

Subsequent to removal of the second photosensitive film pattern, a third layer of a metal selected from a group consisting of aluminum, tungsten and Al—Cu—Si alloy, is formed over the resulting structure, followed by formation of a third positive photosensitive film 33 which is then exposed to light by use of a third light-exposure mask 34 for the inner box, as shown in FIG. 4E. The third light-exposure mask 34, which is used to apply photo etch to the third layer 32 deposited inside the chip, is structured 30 as not to expose the third photosensitive film in the central area of the outer box formed over the scribe line.

Finally, the light-exposed area of the third photosensitive film 33 is removed to form a pattern measuring, 10×10 µm², which is the inner box.

The resulting overlay accuracy-measuring mark has a groove which is formed along the inside edge of the outer box, and which serves as a buffer zone along which reflowing materials can flow during the course of the chip preparation.

In accordance with another aspect of the present invention, when the first light-exposure mask 24 is formed as described in FIG. 4A, the processes may be carried out after establishing a light-exposure area as predetermined by the outer box form. In this case, the first layer is completely removed inside the outer box.

In accordance with a further aspect of the present invention, while the processes for forming the groove 35 of regular tetragon may be omitted the processes of forming the second photosensitive film pattern for the outer box mask, etching the light-exposed area of the second layer 27 and etching the light-exposed area of the first layer 26 by the etched second layer, are carried out in the stage of FIG. 4D.

In order to accurately define the boundary line of the outer mark, there is provided an enlarged stepped portion on the edge portion of the outer box through formation of a groove inside the outer mark, according to the present invention.

Alternatively, negative photosensitive films may be used for the photosensitive film patterns, instead of positive photosensitive films. In this case, the light-exposure masks are set in reverse, in order to form the overlay accuracy-measuring mark.

An overlay accuracy-measuring mark consisting of an outer box and an inner box is prepared, wherein the outer box has increased stepped portion at its inside boundary line and a metal layer is formed over the stepped portion, whereby the boundary line can be easily defined and the overlay accuracy can be definitely measured.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for preparing a pattern overlay accuracy-measuring mark on a semiconductor wafer, comprising the steps of:

applying photoetch to a first layer formed over a scribe line on said wafer, to form a tetragonal groove along the inside boundary line of a predetermined area;

forming a second layer entirely over said first layer and removing a tetragonal area formed by use of a light-exposure mask of the second layer through photo etching, to form an outer box with said groove being exposed therethrough;

forming a metal layer entirely over said second layer; and then forming an inner box at the central portion of the outer box by use of a tetragonal pattern of photosensitive film located over the metal layer.

2. A method for preparing a pattern overlay accuracy-measuring mark as set forth in claim 1, wherein said metal layer is formed of tungsten or Al—Cu—Si alloy.

3. A method for preparing a pattern overlay accuracy-measuring mark as set forth in claim 1, wherein said tetragonal groove is formed by use of the same light-exposure mask as is employed to form said outer box.

4. A method for preparing a pattern overlay accuracy-measuring mark on a semiconductor wafer, comprising the steps of:

covering the entire upper surface of a first layer coated on a scribe line on said wafer with a second layer and removing a tetragonal area of said second layer through photoetching, to form an outer box;

etching the exposed area of said first layer, to form a groove along the inside boundary line of said outer box; and then forming a metal layer entirely over the resulting structure before forming an inner box at the central portion of the outer box by use of a tetragonal pattern of photosensitive film located over the metal layer.

5. A method for preparing a pattern overlay accuracy-measuring mark as set forth in claim 4, wherein said metal layer is formed of tungsten of Al—Cu—Si alloy.

6. A method for preparing a pattern overlay accuracy measuring mark as set forth in claim 4, wherein said first layer is formed of inter-polyoxide.

7. A method for preparing a pattern overlay accuracy-measuring mark as set forth in claim 4, wherein said second layer is formed of polysilicon.

* * * * *